United States Patent
Lee et al.

(10) Patent No.: US 9,117,917 B2
(45) Date of Patent: Aug. 25, 2015

(54) THIN FILM TRANSISTOR, THIN FILM TRANSISTOR PANEL, AND METHOD FOR MANUFACTURING THE SAME

(71) Applicant: Samsung Display Co., Ltd., Yongin, Gyeonggi-do (KR)

(72) Inventors: Hyun-Jung Lee, Dongducheon-si (KR); Sung-Haeng Cho, Chungcheongbuk-do (KR); Woo-Geun Lee, Yongin-si (KR); Jang-Hoon Ha, Suwon-si (KR); Hee-Jun Byeon, Suwon-si (KR); Ji-Yun Hong, Seoul (KR); Ji-Soo Oh, Uiwang-si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 0 days.

(21) Appl. No.: 13/650,528

(22) Filed: Oct. 12, 2012

(65) Prior Publication Data

US 2013/0099240 A1    Apr. 25, 2013

(30) Foreign Application Priority Data

Oct. 12, 2011    (KR) .................. 10-2011-0103921

(51) Int. Cl.
   *H01L 27/15*    (2006.01)
   *H01L 29/786*   (2006.01)

(52) U.S. Cl.
   CPC .................... *H01L 29/7869* (2013.01)

(58) Field of Classification Search
   CPC ....... G02F 1/1343; G02F 1/36; H01L 29/786; H01L 27/01; H01L 27/15; H01L 33/08
   See application file for complete search history.

(56) References Cited

U.S. PATENT DOCUMENTS

| | | | | |
|---|---|---|---|---|
| 4,954,855 | A * | 9/1990 | Mimura et al. | 257/61 |
| 2005/0018097 | A1 * | 1/2005 | Kwon et al. | 349/43 |
| 2005/0041187 | A1 * | 2/2005 | Song et al. | 349/139 |
| 2009/0315026 | A1 * | 12/2009 | Jeong et al. | 257/43 |
| 2010/0301328 | A1 | 12/2010 | Yamazaki et al. | |
| 2011/0240986 | A1 * | 10/2011 | Tsai et al. | 257/43 |
| 2012/0205647 | A1 * | 8/2012 | Heo | 257/43 |
| 2012/0242923 | A1 * | 9/2012 | Miyamoto et al. | 349/43 |

* cited by examiner

*Primary Examiner* — David Vu
*Assistant Examiner* — Mouloucoulaye Inoussa
(74) *Attorney, Agent, or Firm* — F. Chau & Associates, LLC

(57) ABSTRACT

A Thin Film Transistor (TFT) includes a substrate, a semiconductor layer disposed on the substrate a first source electrode and a first drain electrode spaced apart from each other on the semiconductor layer, a channel area disposed in the semiconductor layer between the first source electrode and the first drain electrode, an etching prevention layer disposed on the channel area, the first source electrode, and the first drain electrode and a second source electrode in contact with the first source electrode, and a second drain electrode in contact with the first drain electrode.

18 Claims, 9 Drawing Sheets

ID="1" -->

THIN FILM TRANSISTOR, THIN FILM TRANSISTOR PANEL, AND METHOD FOR MANUFACTURING THE SAME

CROSS-REFERENCE TO RELATED APPLICATION

This application claims to Korean Patent Application filed on Oct. 12, 2011 and assigned Serial No. 10-2011-0103921, the disclosure of which is hereby incorporated by reference herein in its entirety.

TECHNICAL FIELD

The present disclosure relates to a thin film transistor (TFT), a TFT panel, and a method for manufacturing the same.

DISCUSSION OF THE RELATED ART

Recently, display devices such as, for example, a liquid crystal display device and an organic light-emitting device are employing TFTs that use an oxide semiconductor layer as a channel, for high resolution and high-speed driving.

Commonly, a TFT with an oxide semiconductor layer has a bottom gate structure in which a gate electrode is located near a substrate. In the TFT with a bottom gate structure, a source electrode and a drain electrode may be located on the oxide semiconductor layer. A TFT's channel is formed on the oxide semiconductor layer between the source and drain electrodes, and a channel length is, for example, a distance between a contact of the oxide semiconductor layer and the source electrode and a contact of the oxide semiconductor layer and the drain electrode. When the source and drain electrodes containing a metal are etched, the oxide semiconductor layer may be damaged. To prevent the above-mentioned damage, an etching prevention layer is formed on the oxide semiconductor layer, and the source and drain electrodes are formed on the etching prevention layer. The source and drain electrodes are spaced apart from each other, and overlap both ends of the etching prevention layer interposed between the source and drain electrodes. In this case, the TFT's channel length corresponds to a length of the etching prevention layer. If the length of the etching prevention layer is reduced, the channel length may also be reduced. However, the minimum distance A between the source and drain electrodes and the minimum overlapping distance OD of each of the source and drain electrodes overlapping the etching prevention layer are given by a manufacturing process. Therefore, the length of the etching prevention layer, e.g., a TFT's channel length L, is a minimum of A+2OD. In this structure where the source and drain electrodes overlap the etching prevention layer, the TFT's channel length L may not be reduced to be shorter than A+2OD undesirably. In the case where the channel length L is reduced to be shorter than A+2OD despite the restriction, the oxide semiconductor layer may be etched when the source and drain electrodes are formed, thereby causing a failed TFT. In other words, when mask misalignment occurs between the etching prevention layer and the source and drain electrodes, a sidewall of the source or drain electrode may be spaced apart from a sidewall of the etching prevention layer in a process of forming the source and drain electrodes, so the oxide semiconductor layer exposed by the misalignment may be damaged in the etching process, thereby causing malfunction of the TFT. Forming the etching prevention layer to have a length of A+2OD to solve the above difficulty may cause an increase in channel length.

When the channel length increases, a channel width should be increased for the TFT to flow a predetermined current Ids during its operation. The increase in channel length and channel width may mean an increase in TFT size. The increase in channel width may increase the area of the source and drain electrodes. The increase in the area of the source electrode may increase a capacitance Cgs between the gate electrode and the source electrode. The increase in Cgs may increase a kick-back voltage and causes variation of the kick-back voltage of TFTs in a display device, leading to poor picture quality. In addition, the increase in the area of the source and drain electrodes may cause a reduction in aperture ratio of the display device.

SUMMARY OF THE INVENTION

An exemplary embodiment of the present invention provides a Thin Film Transistor (TFT) with a capacitance Cgs between a gate electrode and a source electrode reduced, a TFT panel, and a method for manufacturing the same.

An exemplary embodiment of the present invention provides a size-reduced TFT, a TFT panel with the size-reduced TFT, and a method for manufacturing the same.

Further, an exemplary embodiment of the present invention provides a TFT panel with an increased aperture ratio, and a method for manufacturing the same.

In accordance with an exemplary embodiment of the present invention, a Thin Film Transistor (TFT) is provided. The TFT includes a substrate, a semiconductor layer disposed on the substrate, a first source electrode and a first drain electrode spaced apart from each other on the semiconductor layer, a channel area disposed in the semiconductor layer between the first source electrode and the first drain electrode, an etching prevention layer disposed on the channel area, the first source electrode, and the first drain electrode and a second source electrode in contact with the first source electrode, and a second drain electrode in contact with the first drain electrode.

A shortest distance between a contact of the first source electrode and the second source electrode and a contact of the first drain electrode and the second drain electrode may be greater than a channel length.

A gap between the second source electrode and the second drain electrode may be greater than is greater than a gap between the first source electrode and the first drain electrode.

Sidewalls of the semiconductor layer and outer sidewalls of the first source electrode and the first drain electrode may be aligned substantially on the same line.

The etching prevention layer may cover sidewalls of the semiconductor layer.

The etching prevention layer may have a first via hole and a second via hole, the first source electrode and the second source electrode may be in contact with each other through the first via hole, and the first drain electrode and the second drain electrode may be in contact with each other through the second via hole.

In accordance with an exemplary embodiment of the present invention, a method for manufacturing a Thin Film Transistor (TFT) is provided. The method includes forming a semiconductor layer on a substrate, forming a first source electrode and a first drain electrode spaced apart from each other on the semiconductor layer, forming an etching prevention layer on the first source electrode and the first drain electrode, and forming a second source electrode and a second drain electrode on the etching prevention layer. The second source electrode and the second drain electrode are electrically connected to the first source electrode and the first drain electrode, respectively. The forming of the first source electrode and the first drain electrode and the forming of the etching prevention layer may be performed with a single mask.

In accordance with an exemplary embodiment of the present invention, a Thin Film Transistor (TFT) panel is provided. The TFT panel includes a gate line including a gate pad and a gate electrode disposed on a substrate, a semiconductor layer disposed on the gate electrode, a first source electrode and a first drain electrode spaced apart from each other on the semiconductor layer, an etching prevention layer disposed on the first source electrode, the first drain electrode, and the semiconductor layer exposed between the first source electrode and the first drain electrode and a second source electrode in contact with the first source electrode, a second drain electrode in contact with the first drain electrode, and a data line including a data pad.

The etching prevention layer may cover sidewalls of the semiconductor layer.

The etching prevention layer may overlap the gate electrode.

The TFT panel may further include a protection film disposed on the data line and having a contact hole formed exposing the second drain electrode and a pixel electrode disposed on the protection film and electrically connected to the second drain electrode through the contact hole. The etching prevention layer may overlap the contact hole.

A sidewall of the etching prevention layer may be located between a sidewall of the gate electrode and a sidewall of the pixel electrode.

The etching prevention layer may be located on the gate pad.

The etching prevention layer may be located under the data pad.

In accordance with an exemplary embodiment of the present invention, a Thin Film Transistor (TFT) panel is provided. The TFT panel includes a gate line including a gate pad and a gate electrode disposed on a substrate, a storage electrode line disposed on the substrate adjacent to the gate line and extending substantially in parallel to the gate line, a gate insulating film disposed on the gate line and the storage electrode line, a semiconductor layer disposed on the gate insulating film, a first source electrode and a first drain electrode spaced apart from each other on the semiconductor layer, a channel area disposed in the semiconductor layer between the first source electrode and the first drain electrode, an etching prevention layer disposed on the first source electrode, the first drain electrode and the gate insulating film, a second source electrode and a second drain electrode disposed on the etching prevention layer. The second source electrode is in contact with the first source electrode, and the second drain electrode is in contact with the first drain electrode.

The TFT panel further includes a data line disposed on the etching prevention layer, and the data line includes a data pad formed at one end of the data line, a protection film disposed on the second source electrode, the second drain electrode and the etching prevention layer, and the protection film includes a first contact hole passing through the protection film which exposes a portion of the second drain electrode, a second contact hole passing through the protection film exposing a portion of the data pad and a third contact hole passing through the protection film, the etching prevention layer and the gate insulating film to expose a portion of the gate pad.

In addition, the TFT panel further includes a pixel electrode disposed on the protection film, and the pixel electrode is electrically connected to the second drain electrode through the first contact hole and a first contact member and a second contact member disposed on the protection film. The first contact member is electrically connected to the data pad through the second contact hole and the second contact member is electrically connected to the gate pad through the third contact hole.

BRIEF DESCRIPTION OF THE DRAWINGS

Exemplary embodiments of the present invention can be understood in more detail from the following detailed description taken in conjunction with the accompanying drawings, in which.

DETAILED DESCRIPTION OF EXEMPLARY EMBODIMENTS

Figure 1:
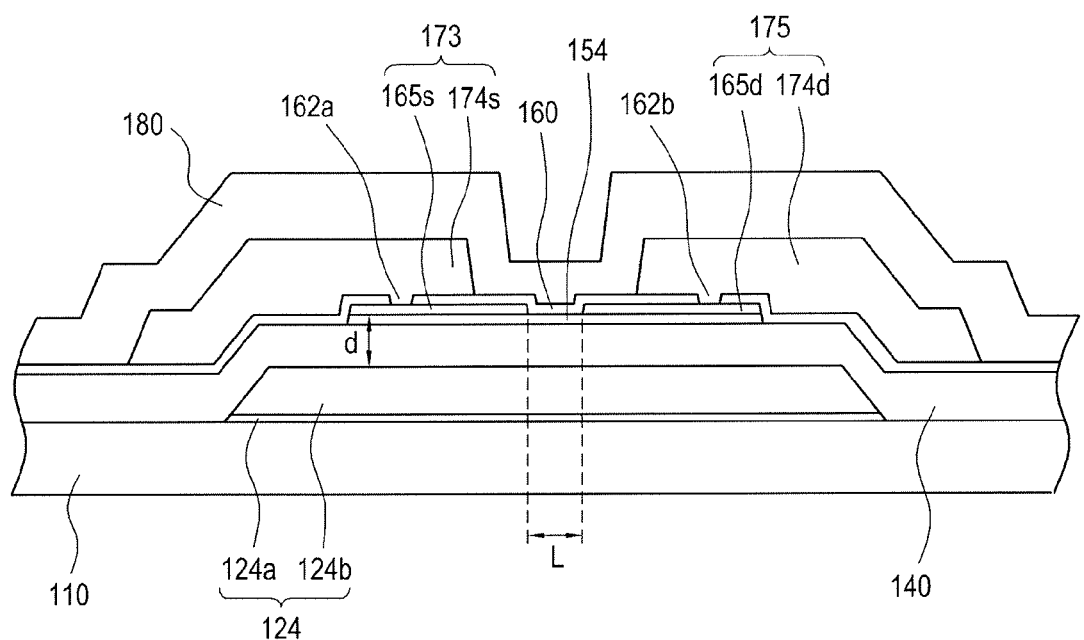
FIG. 1 is a cross-sectional view of a TFT according to an embodiment of the present invention.

Exemplary embodiments of the present invention will now be described in detail with reference to the accompanying drawings. Throughout the specification, the same drawing reference numerals will be understood to refer to the same elements, features and structures.

In the drawings, the thickness of layers, films, panels, regions, etc., may be exaggerated for clarity. It will be understood that when an element such as, for example, a layer, film, region, or substrate is referred to as being "on", "connected to" or "coupled to" another element, it can be directly on, connected to or coupled to the other element or an intervening element or elements may also be present. Like reference numerals designate like elements throughout the specification.

As used herein, the singular forms, "a", "an", and "the" are intended to include plural forms as well, unless the context clearly indicates otherwise.

FIG. 1 is a cross-sectional view of a TFT according to an embodiment of the present invention.

Referring to FIG. 1, a gate electrode 124 is disposed on a substrate 110. The substrate 110 may be made of, for example, monocrystalline or polycrystalline silicon, or may be made of a glass or plastic material. For example, in an exemplary embodiment, the substrate 110 may be also be formed of a flexible material such as polyethylene terephthalate (PET), polyethylene naphthalate (PEN), polyester ionomer, polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoro-alboxy) fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA).

The gate electrode 124 may have, for example, a double-layer structure including a first layer 124a formed of titanium or titanium alloy and a second layer 124b formed of copper or copper alloy. In the alternative, the double-layer structure may include, for example, any one of Mo/Al, Ti/Al, Ta/Al, Ni/Al, TiNx/Al, Co/Al, CuMn/Cu, Ti/Cu, TiN/Cu, Mo/Cu, and TiOx/Cu. According to an embodiment of the present invention, the gate electrode 124 may alternatively have, for example, a triple-layer structure. The triple-layer structure may include, for example, any one of Mo/Al/Mo, Ti/Cu/CuMn, TiMn/Cu/CuMn, CuMn/Cu/CuMn, Ti/Cu/Ti, TiNx/Cu/TiNx, and TiOx/Cu/TiOx.

A gate insulating film 140 is formed on the gate electrode 124. The gate insulating film 140 may include, for example, first and second gate insulating films (not shown). The first gate insulating film in contact with the gate electrode 124 may be formed of, for example, silicon nitride (SiNx). The second gate insulating film in contact with a below-described semiconductor layer 154 may be formed of, for example, silicon oxide (SiOx). According to an embodiment of the present invention, the gate insulting film 140 may contain, for example, SiOxNy, SiOF, SiNF or SiONF.

The semiconductor layer 154 is formed on the gate insulating film 140 such that sidewalls of the semiconductor layer 154 may be located within inner sidewalls of the gate electrode 124. The semiconductor layer 154 may be made of, for example, an oxide semiconductor. The oxide semiconductor may contain, for example, indium-gallium-zinc-oxide (InGaZnO) or indium-zinc-tin-oxide (InZnSnO). In the alternative, the oxide semiconductor may be, for example, a compound having a formula expressed as $A_xB_xO_x$ or $A_xB_xC_xO_x$, where A may be any one of zinc (Zn) and cadmium (Cd), B may be any one of gallium (Ga), tin (Sn) and indium (In), and C may be any one of zinc (Zn), cadmium (Cd), gallium (Ga), indium (In) and hafnium (Hf). X is not zero (0), and A, B and C are different from each other. According to an exemplary embodiment of the present invention, the oxide semiconductor may be, for example, a material selected from the group comprising InZnO, InGaO, InSnO, ZnSnO, GaSnO, GaZnO, GaZnSnO, GaInZnO, ZnSnInO, HfInZnO, HfZnSnO and ZnO. This oxide semiconductor has an effective mobility which is, for example, approximately 2 times to approximately 100 times that of hydrogenated amorphous silicon.

A source electrode 173 and a drain electrode 175 are formed on the semiconductor layer 154. For example, the source and drain electrodes 173 and 175 are spaced apart from each other, overlapping at least a portion of the gate electrode 124 disposed thereunder. The source electrode 173 includes, for example, first and second source electrodes 165s and 174s. The drain electrode 175 includes, for example, first and second drain electrodes 165d and 174d.

The first source electrode 165s and the first drain electrode 165d are formed on the semiconductor layer 154 to be spaced apart from each other. Sidewalls of the first source and drain electrodes 165s and 165d are, for example, substantially aligned with sidewalls of the semiconductor layer 154.

For example, one surface of each of the first source and drain electrodes 165s and 165d is in contact with the semiconductor layer 154, and at least a portion of each of the other surfaces thereof is in contact with each of the second source and drain electrodes 174s and 174d. The first source and drain electrodes 165s and 165d may be formed of, for example, the same material, and may include a conductive oxide semiconductor. According to an embodiment of the present invention, the first source and drain electrodes 165s and 165d may contain, for example, gallium-zinc-oxide (GaZnO). The content ratio of zinc (Zn) to gallium (Ga) contained in the gallium-zinc-oxide (GaZnO) may be, for example, a ratio of approximately 2 atomic % to approximately 20 atomic % to approximately 80 atomic % to approximately 98 atomic %.

The first source and drain electrodes 165s and 165d serve to reduce a contact resistance between the semiconductor layer 154 and the second source electrode 174s and a contact resistance between the semiconductor layer 154 and the second drain electrode 174d, respectively. A carrier concentration of the first source or drain electrode 165s or 165d may fall within a range between, for example, approximately $10^{17}/cm^3$ to approximately $10^{21}/cm^3$. According to an embodiment of the present invention, a carrier concentration of the first source and drain electrodes 165s and 165d may be adjusted, for example, depending on the type or composition ratio of elements contained in the first source and drain electrodes 165s and 165d. For example, the first source and drain electrodes 165s and 165d may contain zinc oxide (ZnO) or tin oxide ($SnO_2$). To adjust a carrier concentration of the zinc oxide (ZnO) or tin oxide ($SnO_2$), a material selected from the group comprising aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), antimony (Sb), arsenic (As), niobium (Nb), tantalum (Ta), and mixtures thereof may be used as a dopant.

The first source and drain electrodes 165s and 165d may be formed to have a thickness of, for example, approximately 100 Å to approximately 600 Å. If the semiconductor layer 154 is an oxide semiconductor containing indium (In), the first source and drain electrodes 165s and 165d may suppress precipitation of indium (In) by reduction of indium (In). The first source and drain electrodes 165s and 165d may prevent metal atoms of the second source and drain electrodes 174s and 174d from undergoing diffusion or electromigration into the semiconductor layer 154. A channel area is formed in the semiconductor layer 154 between the first source and drain electrodes 165s and 165d. A channel length L is determined by, for example, a distance between a contact between the first source electrode 165s and the semiconductor layer 154 and a contact between the first drain electrode 165d and the semiconductor layer 154.

For example, an etching prevention layer 160 is formed on the first source electrode 165s, the first drain electrode 165d, the channel area between the first source and drain electrodes 165s and 165d and the gate insulating film 140. The etching prevention layer 160 is, for example, in contact with the exposed semiconductor layer 154 between the first source and drain electrodes 165s and 165d. The etching prevention layer 160 covers, for example, sidewalls of the semiconductor layer 154. The etching prevention layer 160 may contain, for example, silicon oxide (SiOx). The etching prevention layer 160 may have, for example, a thickness of approximately 300 Å to approximately 600 Å.

First and second via holes 162a and 162b are formed in the etching prevention layer 160. The first via hole 162a exposes, for example, a portion of the first source electrode 165s, the second via hole 162b exposes, for example, a portion of the first drain electrode 165d. A gap between the first and second via holes 162a and 162b is, for example, greater than the channel length L.

The second source and drain electrodes 174s and 174d are formed on the etching prevention layer 160, and are electrically connected to the first source and drain electrodes 165s and 165d through the first and second via holes 162a and 162b, respectively. A gap between the second source and drain electrodes 174s and 174d is, for example, greater than a gap between the first source and drain electrodes 165s and 165d. The second source and drain electrodes 174s and 174d may be formed of, for example, the same material. For example, the second source and drain electrodes 174s and 174d may be made of copper (Cu) or copper alloy. The copper alloy may contain, for example, copper and any one of manganese (Mn), magnesium (Mg), aluminum (Al), zinc (Zn) and tin (Sn) of approximately 0.1 atomic % to approximately 30 atomic %.

The second source and drain electrodes 174s and 174d may be formed to have, for example, a thickness of approximately 1,000 Å to approximately 5,000 Å. The etching prevention layer 160 is exposed between the second source and drain electrodes 174s and 174d.

Although not illustrated in the drawing, a capping layer may be formed on the second source and drain electrodes 174s and 174d. The capping layer may contain, for example, at least one of Cu-alloy nitride, CuMn alloy, CuMnAl alloy, CuMnN, and CuO. The capping layer may prevent the second source and drain electrodes 174s and 174d from being oxidized in a process of forming a below-described protection film 180.

The protection film 180 is disposed on the second source and drain electrodes 174s and 174d, and the etching prevention layer 160. The protection film 180 may contain, for example, silicon nitride (SiNx). The protection film 180 may have, for example, a thickness of approximately 300 Å to approximately 50,000 Å. The protection film 180 may be formed of inorganic insulating material such as, for example, titanium oxide ($TiO_2$), alumina ($Al_2O_3$) and zirconia ($ZrO_2$), silicon oxide ($SiO_2$), silicon nitride ($SiN_x$), silicon oxynitride (SiON), tantalum oxide ($Ta_2O_3$), hafnia ($HfO_2$), barium strontium titanate (BST), and lead zirconate titanate (PZT), or organic insulating material such as, for example, poly siloxane, phenyl siloxane, polyimide, polyamide, silsesquioxane and silane, BCB (benzocyclobutene), and an acrylic resin.

According to an embodiment of the present invention, as the first source and drain electrodes 165s and 165d are located under the etching prevention layer 160, the channel length L may be determined taking into account, for example, only the process margin. On the other hand, in the conventional art, as the source and drain electrodes are disposed on the etching prevention layer, overlapping at least a portion thereof, the channel length increases by overlapping distances 2OD of the source and drain electrodes and the etching prevention layer. For example, assuming that the minimum distance A between the source and drain electrodes 173 and 175, which is possible in the process, is 3.5 µm, a TFT whose channel length L is 3.5 µm may be formed in an embodiment of the present invention. On the other hand, in the conventional art, the channel length is a sum (A+2OD) of the minimum distance A (=3.5 µm) between the source and drain electrodes and the overlapping distances 2OD of the source and drain electrodes and the etching prevention layer. The increased channel length of the TFT in the conventional art leads to an increase in channel width for the TFT to obtain a predetermined current Ids during its operation, thereby causing an increase in the area of the source and drain electrodes.

Therefore, according to an embodiment of the present invention, the channel width and the TFT size may be reduced by reducing the channel length of the TFT. In addition, a capacitance Cgs between the source and drain electrodes may be reduced by reducing the area of the source and drain electrodes.

In addition, according to an embodiment of the present invention, even though the etching prevention layer 160 undergoes misalignment, the distance d between the gate electrode 124 and the first source electrode 165s, which may affect Cgs, is not changed as the first source and drain electrodes 165s and 165d are formed under the etching prevention layer 160. Therefore, Cgs is not changed by the misalignment of the etching prevention layer 160.

A method for manufacturing the TFT shown in FIG. 1 will be described in detail below with reference to FIGS. 2A to 2F.

Figure 2A:
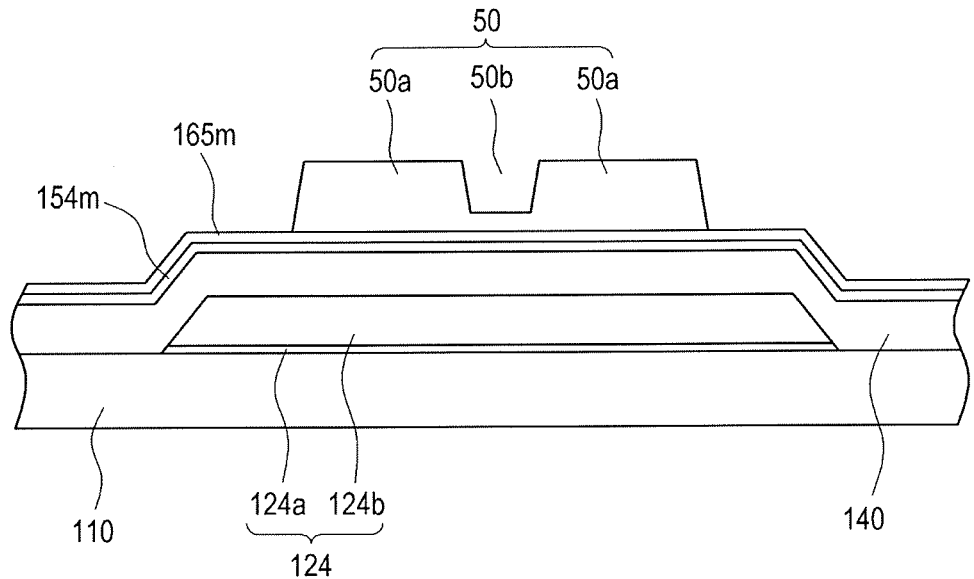
FIGS. 2A to 2F are cross-sectional views illustrating a method for manufacturing the TFT shown in FIG. 1.

Referring to FIG. 2A, a gate conductor layer (not shown) is formed on a substrate 110 by, for example, sputtering. The gate conductor layer forms a gate electrode 124 by being patterned using, for example, photolithography. The gate electrode 124 may have, for example, a double-layer structure including a first layer 124a containing titanium and a second layer 124b containing copper. The titanium may have, for example, a thickness of approximately 50 Å to approximately 1,000 Å, and the copper may have, for example, a thickness of approximately 1,000 Å to approximately 10,000 Å. The gate conductor layer having the double-layer structure of titanium and copper may be patterned by, for example, wet etching. An etchant used for wet etching may contain, for example, ammonium persulfate, aminotetrazole, nitric acid, acetic acid, methane citric acid, and hydrofluoric acid (HF).

A gate insulating film 140 is formed on the gate electrode 124 and the substrate 110 by, for example, chemical vapor deposition (CVD). The gate insulating film 140 may have, for example, a double-layer structure of silicon nitride (SiNx) and silicon oxide (SiOx). The silicon nitride (SiNx) may have a thickness of, for example, approximately 1,000 Å to approximately 5,000 Å, and silicon oxide (SiOx) may have, for example, a thickness of approximately 300 Å to approximately 2,000 Å.

A first oxide layer 154m is formed on the gate insulating film 140. The first oxide layer 154m may contain, for example, indium-gallium-zinc-oxide (InGaZnO).

The first oxide layer 154m may be formed by, for example, sputtering to have a thickness of approximately 200 Å to approximately 1,000 Å. In the alternative, the first oxide layer 154m may be formed of, for example, the material described in FIG. 1.

A second oxide layer 165m is formed on the first oxide layer 154m. The second oxide layer 165m may contain, for example, gallium-zinc-oxide (GaZnO). The second oxide layer 165m may be formed by, for example, sputtering to have a thickness of approximately 100 Å to approximately 600 Å. In the alternative, the second oxide layer 165m may be formed of, for example, the material constituting the first source and drain electrodes 165s and 165d described in FIG. 1.

Although not illustrated, a photoresist film is formed on the second oxide layer 165m. The photoresist film is patterned to form patterned photoresist film 50 on the second oxide layer 165m. The photoresist film is patterned by, for example, the known photolithography to form the first source and drain electrodes 165s and 165d shown in FIG. 1. Energy of light irradiated to the photoresist film may be, for example, approximately 40 mJ to approximately 50 mJ. The light energy may vary depending on the thickness and material of the photoresist film . The patterned photoresist film 50 may have, for example, a first thick portion 50a and a second thin portion 50b. The first thick portion 50a and the second thin portion 50b may be formed by, for example, a mask (not shown) having slit or grid patterns and a translucent layer. The second thin portion 50b corresponds to a TFT's channel area.

Figure 2B:
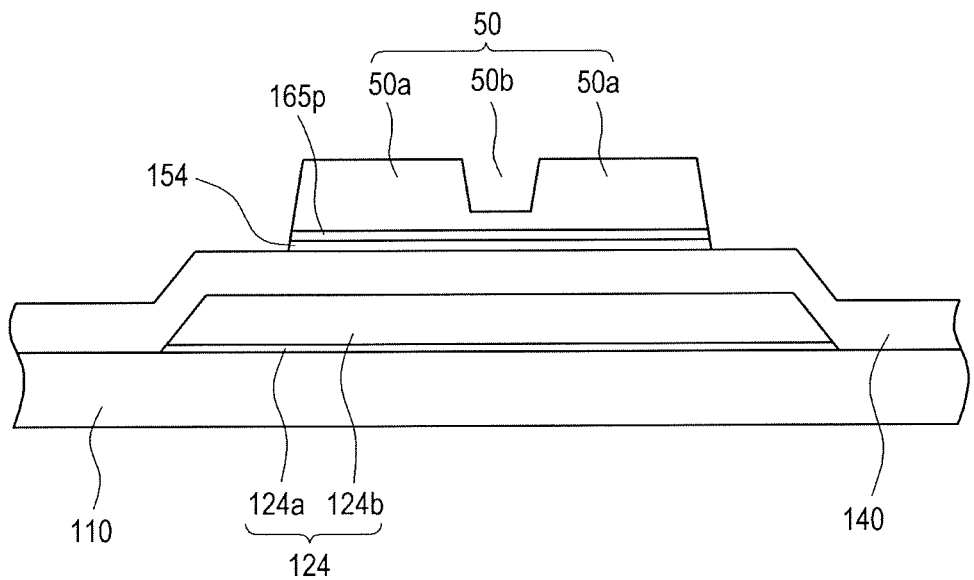

Referring to FIG. 2B, a semiconductor layer 154 and a patterned second oxide layer 165p are formed as the second oxide layer 165m and first oxide layer 154m located in an area where the photoresist film 50 is not formed are removed by, for example, wet etching. A first etchant used for wet etching may contain, for example, persulfate, azole-containing compounds, oxidation regulator, composition stabilizer, and oxide supplement. The oxidation regulator may contain, for example, nitric acid ($HNO_3$) which is inorganic acid, and acetic acid (AA) which is organic acid. The composition stabilizer may contain, for example, a material selected from the group comprising methane citric acid, nitric acid, phosphoric acid, sulfuric acid, hydrochloric acid, and mixtures thereof. The oxide supplement may contain, for example, a fluoride-containing compound containing fluorine (F).

Figure 2C:
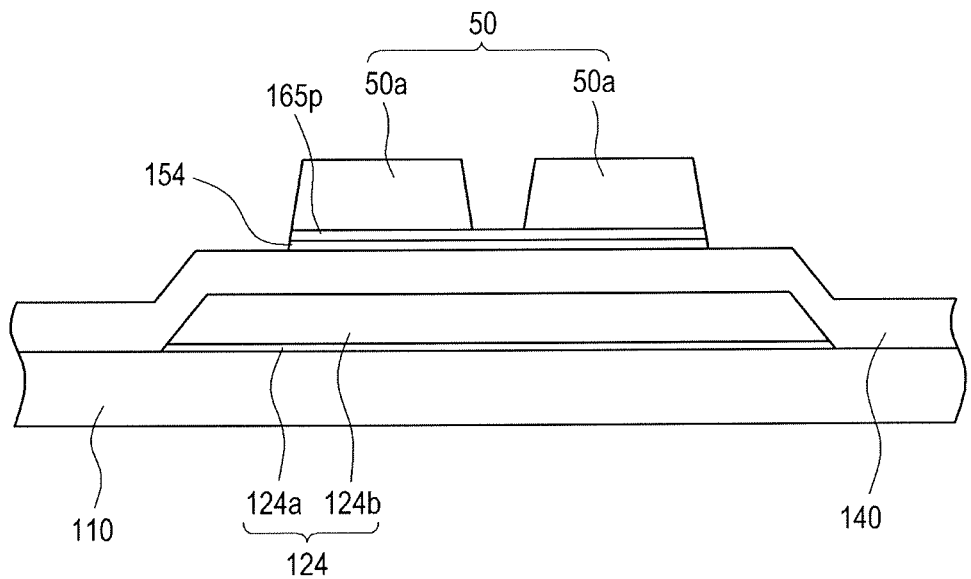

Referring to FIG. 2C, the second thin portion 50b is removed by, for example, the known ashing, and the patterned second oxide layer 165p is exposed.

Figure 2D:
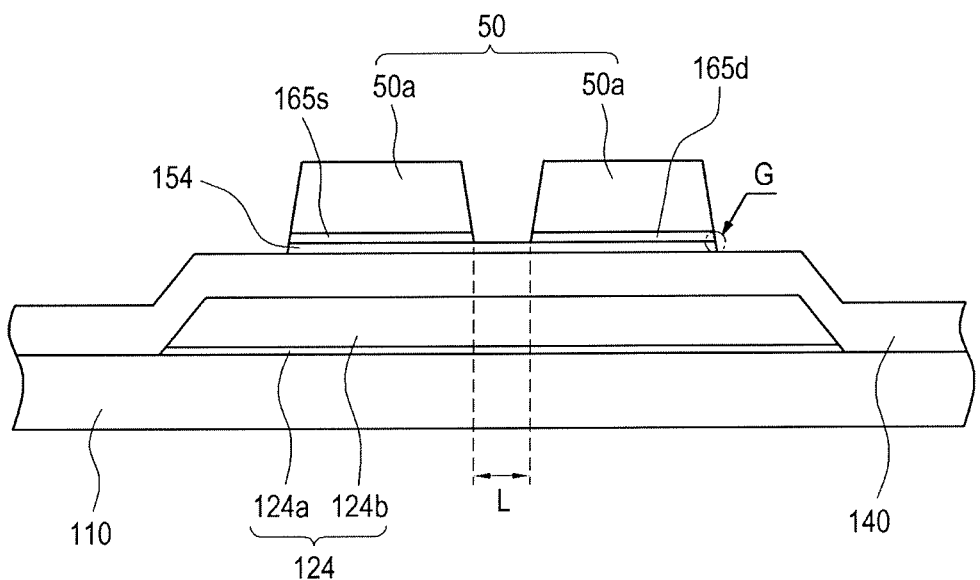

Referring to FIG. 2D, the patterned second oxide layer 165p is removed by, for example, wet etching, thereby forming the first source and drain electrodes 165s and 165d. The semiconductor layer 154 is exposed between the first source and drain electrodes 165s and 165d, and a channel length L is determined. Wet etching may be performed using, for example, an etchant obtained by excluding the oxide supplement from the above-described first etchant.

Figure 2E:
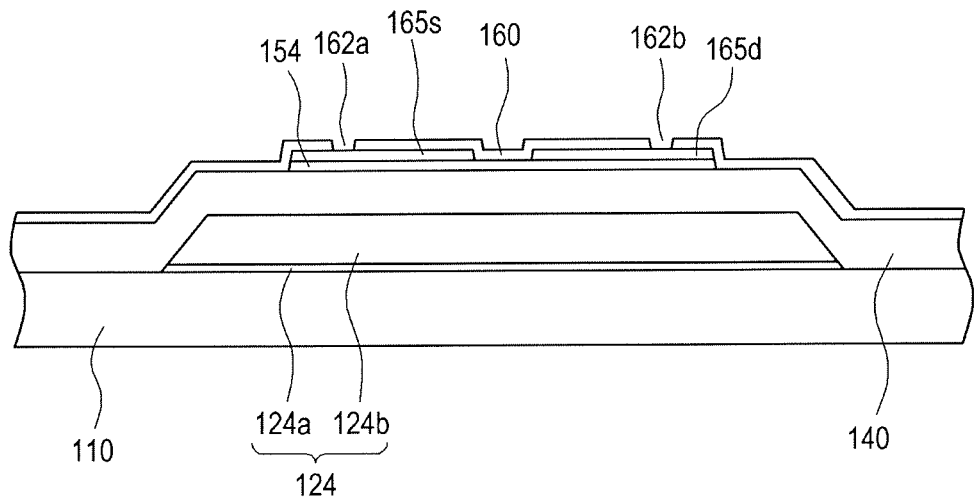

Referring to FIG. 2E, after the patterned photoresist film 50 in FIG. 2D is removed, an etching prevention layer 160 is formed on the first source and drain electrodes 165s and 165d, the semiconductor layer 154 exposed between the first source and drain electrodes 165s and 165d, and the gate insulting film 140. The etching prevention layer 160 may contain, for example, silicon oxide (SiOx), and may be formed by, for example, CVD. The etching prevention layer 160 is patterned by, for example, dry etching to form a first via hole 162a exposing the first source electrode 165s and a second via hole 162b exposing the first drain electrode 165d. Dry etching may be performed using, for example, a gas containing fluorine such as $C_4F_8$, $C_3F_8$, $C_2HF_5$, $CF_4$, $CHF_3$, $CH_2F_2$, $CH_3F$, $C_2F_6$, $C_4F_6$, $C_5F_8$, $C_2F_8$, $NF_3$ and $SF_6$. The etching prevention layer 160 is formed to cover sidewalls of the semiconductor layer 154, thereby preventing the semiconductor layer 154 from being contaminated in a process where below-described second source and drain electrodes 174s and 174d containing copper or copper alloy are formed.

Figure 2F:
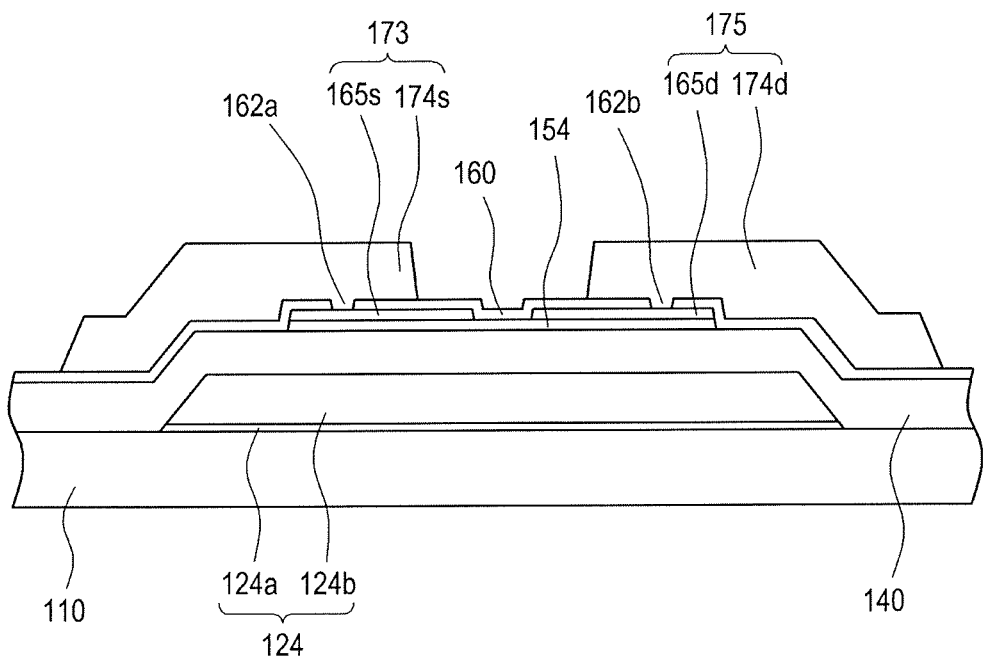

Referring to FIG. 2F, a conductive layer (not shown) is formed on the etching prevention layer 160 by, for example, sputtering, and patterned by, for example, photolithography, forming the second source and drain electrodes 174s and 174d. The second source electrode 174s is electrically connected to the first source electrode 165s through the first via hole 162a, and the second drain electrode 174d is electrically connected to the first drain electrode 165d through the second via hole 162b. The second source and drain electrodes 174s and 174d may contain the material described in FIG. 1. The second source and drain electrodes 174s and 174d may have, for example, a thickness of approximately 1,000 Å to approximately 5,000 Å.

Thereafter, as illustrated in FIG. 1, a protection film 180 is formed on the second source and drain electrodes 174s and 174d, and the etching prevention layer 160 by, for example, CVD. The protection film 180 may contain, for example, silicon nitride (SiNx) and may further include, for example, an organic film.

Figure 2G:
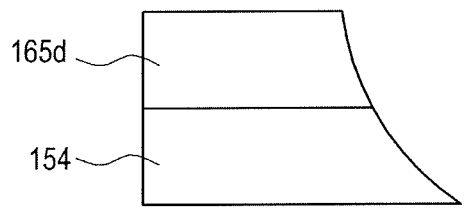
FIG. 2G is a partially enlarged view of the area G shown in FIG. 2D.

According to an embodiment of the present invention, as illustrated in FIGS. 2B to 2D, sidewalls of the semiconductor layer 154 and outer sidewalls of the first source and drain electrodes 165s and 165d are aligned substantially on the same line by being formed by, for example, a single etching process that uses the same mask. The term 'substantially same line' as used herein may refer not only to a straight line, but also to a contour of a sidewall which may occur by a single etching process. For example, when wet etching having isotropic etching characteristics is used, the contour of a sidewall may have a curvature shown in FIG. 2G. Alternatively in an embodiment of the present invention, although the semiconductor layer 154 and the first source and drain electrodes 165s and 165d use the same mask, they may be formed by, for example, different etching processes. In this case, the term 'substantially same line' as used herein may refer to a contour of a sidewall, which may occur by a difference between the etching processes. The difference between the etching processes may be, for example, a difference between dry etching and wet etching, or a difference between types of etchants or etching gases.

Sidewalls of the semiconductor layer 154 and the first source electrode 165s, which are aligned substantially on the same line, and sidewalls of the semiconductor layer 154 and the first drain electrode 165d, which are aligned substantially on the same line, may have, for example, symmetrical shapes.

According to an embodiment of the present invention, as the etching prevention layer 160 is formed to cover the top and sidewalls of the semiconductor layer 154, the semiconductor layer 154 is not exposed in a process where the second source and drain electrodes 174s and 174d are formed. For example, when the second source and drain electrodes 174s and 174d contain copper and the semiconductor layer 154 is made of an oxide semiconductor as described in FIG. 1, the oxide semiconductor may undergo a change in characteristics by being contaminated by copper. Therefore, the etching prevention layer 160 is formed to cover the top and sidewalls of the semiconductor layer 154, thereby preventing the oxide semiconductor from being contaminated by copper.

Figure 3:
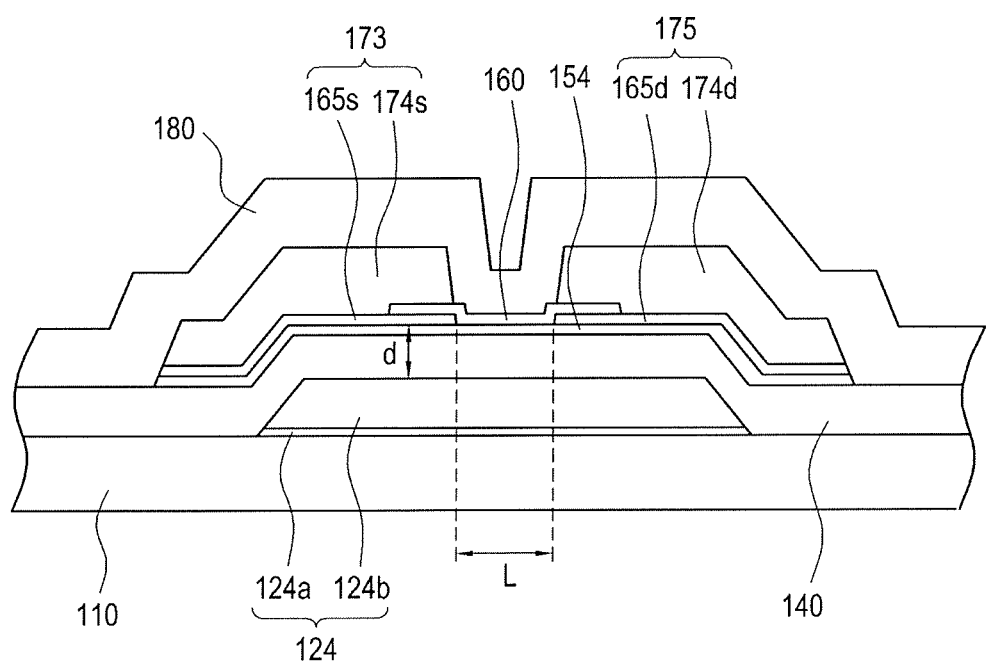
FIG. 3 is a cross-sectional view of a TFT according to an embodiment of the present invention.

FIG. 3 is a cross-sectional view of a TFT according to an embodiment of the present invention. The TFT is substantially the same as the TFT described in FIG. 1 except for the shapes of the etching prevention layer 160 and the source and drain electrodes 173 and 175. In FIG. 1, the etching prevention layer 160 is formed on the gate insulating film 140, the first source and drain electrodes 165s and 165d, the semiconductor layer 154 exposed between the first source and drain electrodes 165s and 165d, and the sidewalls of the semiconductor layer 154. On the other hand, the etching prevention layer 160 in FIG. 3 is formed on the top of the semiconductor layer 154 exposed between the first source and drain electrodes 165s and 165d, and partially on top of the first source and drain electrodes 165s and 165d. Therefore, the exposed first source and drain electrodes 165s and 165d are in contact with the second source and drain electrodes 174s and 174d without the first and second via holes 162a and 162b formed in FIG. 1. The shortest distance between a contact of the first and second source electrodes 165s and 174s and a contact of the first and second drain electrodes 165d and 174d is, for example, greater than a channel length L.

The first source and drain electrodes 165s and 165d in FIG. 1 are different in shape from the second source and drain electrodes 174s and 174d. Inner sidewalls of the first source and drain electrodes 165s and 165d protrude, for example, more than inner sidewalls of the second source and drain electrodes 174s and 174d. Outer sidewalls of the second source and drain electrodes 174s and 174d protrude, for example, more than outer sidewalls of the first source and drain electrodes 165s and 165d. As shown in FIG. 1, a gap between the second source and drain electrodes 174s and 174d is, for example, greater than a gap between the first source and drain electrodes 165s and 165d. The degree of protrusions of the sidewalls or the gap between the source and drain electrodes 173 and 175 may vary depending on the design or process conditions. On the other hand, sidewalls of the first and second source electrodes 165s and 174s and sidewalls of the first and second drain electrodes 165d and 174d in FIG. 3 are aligned substantially on the same line.

A method for manufacturing the TFT in FIG. 3 is substantially the same as the manufacturing method described in FIGS. 2A to 2G except that the first source and drain electrodes 165s and 165d and the second source and drain electrodes 174s and 174d are formed by the same mask. The patterned photoresist film 50 in FIG. 2A and the second source and drain electrodes 174s and 174d in FIG. 2F are formed by different masks.

On the other hand, in an embodiment of FIG. 3, the mask used to form the first source and drain electrodes 165s and 165d may be used to form the second source and drain electrodes 174s and 174d. However, when the second source and drain electrodes 174s and 174d are formed, the pattern of the photoresist film 50 having the second thin portion 50b for forming the channel area, shown in FIG. 2A, is not required. Therefore, the photoresist film is exposed to the light having energy greater than that of light used to form the patterned photoresist film 50 in FIG. 2A. For example, the photoresist film pattern for forming the second source and drain electrodes 174s and 174d in FIG. 3 may be formed by being exposed to the light that has been increased by approximately 10% to approximately 30%. By doing so, the photoresist film pattern without the second thin portion 50b for forming the channel area, shown in FIG. 2A, is formed, and the second source and drain electrodes 174s and 174d may be formed by using the photoresist film pattern as a mask pattern. Sidewalls of the first source and drain electrodes 165s and 165d and sidewalls of the second source and drain electrodes 174s and 174d may be, for example, aligned substantially on the same line within an inter-layer misalignment range. The size of the source and drain electrodes 173 and 175 may vary depending on the design or process conditions. For example, unlike in FIG. 3, sidewalls of the source and drain electrodes 173 and 175 and the semiconductor layer 154 may be located inside the sidewalls of the gate electrode 124. In addition, even though the second source and drain electrodes 174s and 174d have been formed using the same mask as that of the first source and drain electrodes 165s and 165d, the sidewalls may not be aligned on the same line depending on the difference between photolithography process conditions.

Figure 4:
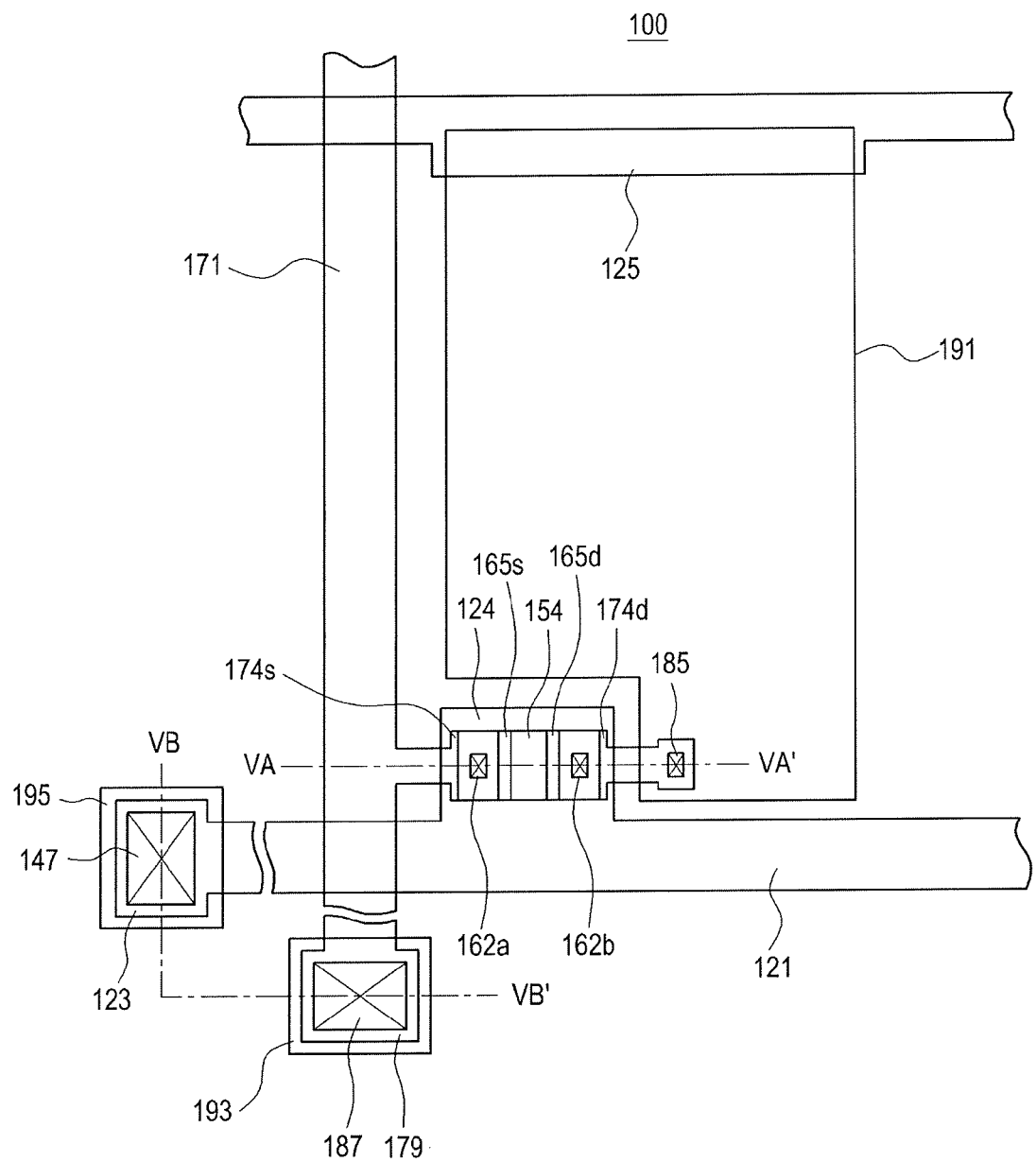
FIG. 4 is a layout of a TFT panel according to an embodiment of the present invention.
Figure 5A:
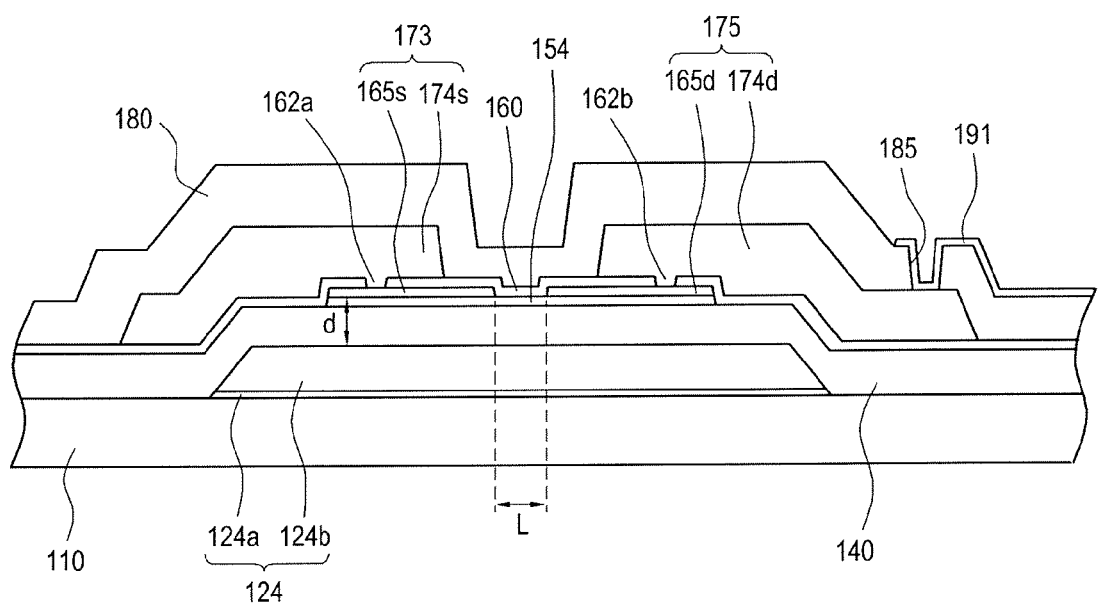
FIG. 5A is a cross-sectional view taken along the line VA-VA' of the TFT panel shown in FIG. 4.
Figure 5B:
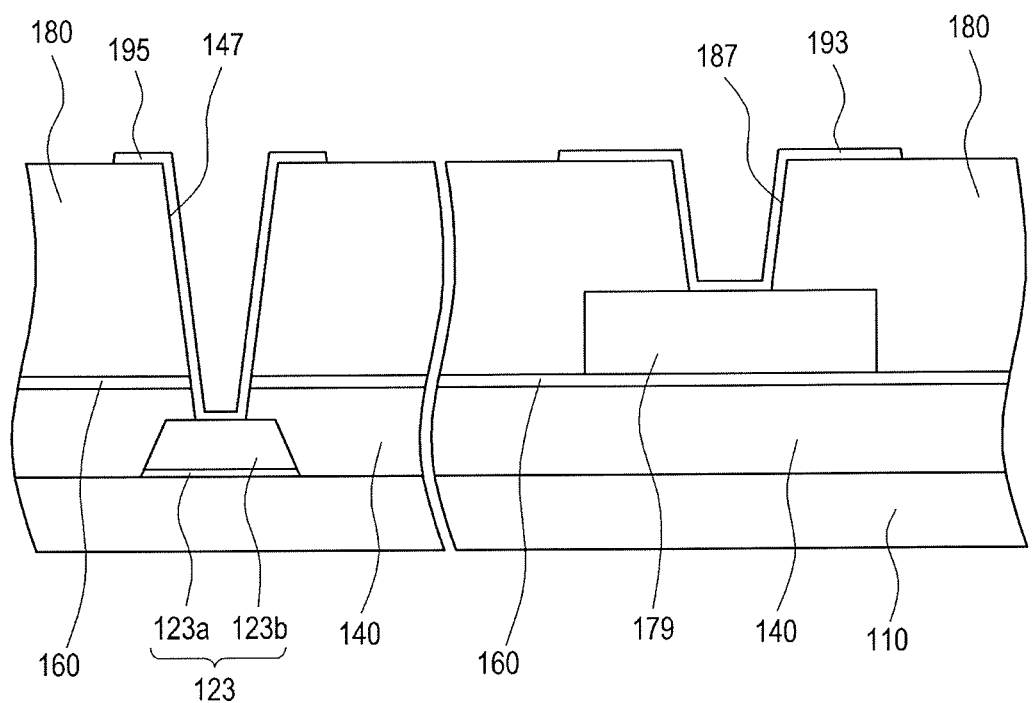
FIG. 5B is a cross-sectional view taken along the line VB-VB' of the TFT panel shown in FIG. 4.

FIG. 4 is a layout of a TFT panel 100 according to an embodiment of the present invention, and FIGS. 5A and 5B are cross-sectional views taken along the lines VA-VA' and VB-VB' of the TFT panel shown in FIG. 4, respectively. The TFT panel 100 with the TFT in FIG. 1 will be described in detail below with reference to FIGS. 4, 5A and 5B.

Referring to FIGS. 4 and 5A, a gate line 121 and a storage electrode line 125 are formed on a substrate 110. The substrate 110 may be made of, for example, a transparent material such as glass or plastic. For example, in an exemplary embodiment, the substrate 110 may be also be formed of a flexible material such as polyethylene terephthalate (PET), polyethylene naphthalate (PEN), polyester ionomer, polyethersulfone (PES), polycarbonate (PC), polysulfone, a phenolic resin, an epoxy resin, polyester, polyimide, polyetherester, polyetheramide, cellulose nitrate, cellulose acetate, poly(vinyl acetate), polystyrene, polyolefins including polyolefin ionomers, polyamide, aliphatic polyurethanes, polyacrylonitrile, polytetrafluoroethylenes, polyvinylidene fluorides, poly(methyl (x-methacrylates), an aliphatic or cyclic polyolefin, polyarylate (PAR), polyetherimide (PEI), polyethersulphone (PES), polyimide (PI), Teflon poly(perfluoroalboxy) fluoropolymer (PFA), poly(ether ether ketone) (PEEK), poly(ether ketone) (PEK), poly(ethylene tetrafluoroethylene)fluoropolymer (PETFE), and poly(methyl methacrylate) and various acrylate/methacrylate copolymers (PMMA). The gate line 121 transfers a gate signal and extends in the horizontal or row direction. The gate line 121 has a vertically protruding gate electrode 124, and a gate pad 123 to be in contact with a driving circuit (not shown) applying a gate signal. The gate pad 123 may be formed on one end of the gate line 121. The gate line 121 and the gate electrode 124 may have, for example, a double-layer structure including a first layer 124a formed of titanium or titanium alloy and a second layer 124b formed of copper or copper alloy. The gate line 121 and the gate electrode 124 may contain the materials described in connection with FIG. 1.

The storage electrode line 125 overlaps a portion of a below-described pixel electrode 191, thereby forming a storage capacitor. The storage electrode line 125 is provided a constant voltage, and extends, for example, substantially in parallel to and adjacent to the gate line 121. The gate line 121 and the storage electrode line 125 may be formed by the same method as the manufacturing method described in FIG. 2A.

A gate insulating film 140 is formed on the gate line 121 and the storage electrode line 125. The gate insulating film 140 may contain the above-described material, and may be formed by the above-described method.

A semiconductor layer 154 is formed on the gate insulating film 140. The semiconductor layer 154 may be made of, for example, an oxide semiconductor. The oxide semiconductor may be made of the above-described material.

The first source and drain electrodes 165s and 165d are formed on the semiconductor layer 154 to be spaced apart from each other. A channel area is formed in the semiconductor layer 154 exposed between the first source and drain electrodes 165s and 165d. Sidewalls of the first source and drain electrodes 165s and 165d are, for example, aligned substantially on the same line as sidewalls of the semiconductor layer 154. For example, one surface of each of the first source and drain electrodes 165s and 165d is in contact with the semiconductor layer 154, and at least a portion of each of the other surfaces thereof is in contact with each of second source and drain electrodes 174s and 174d. The first source and drain electrodes 165s and 165d may be formed of, for example, the same material. The first source and drain electrodes 165s and 165d may contain the material described in FIG. 1. A channel length L is determined by, for example, a distance between a contact between the first source electrode 165s and the semiconductor layer 154 and a contact between the first drain electrode 165d and the semiconductor layer 154.

An etching prevention layer 160 is formed on the first source and drain electrodes 165s and 165d, and the gate insulting film 140. The etching prevention layer 160 is, for example, in contact with the semiconductor layer 154 exposed between the first source and drain electrodes 165s and 165d. The etching prevention layer 160 covers sidewalls of the semiconductor layer 154. The etching prevention layer 160 may contain, for example, silicon oxide (SiOx). The etching prevention layer 160 may have, for example, a thickness of approximately 300 Å to approximately 600 Å.

First and second via holes 162a and 162b are formed in the etching prevention layer 160. The first via hole 162a exposes, for example, a portion of the first source electrode 165s, and the second via hole 162b exposes, for example, a portion of the first drain electrode 165d. The shortest distance between the first and second via holes 162a and 162b is, for example, greater than the channel length L.

A data line 171 and second source and drain electrodes 174s and 174d are formed on the etching prevention layer 160.

The data line 171 transfers a data signal, and extends in, for example, the vertical or column direction. A data pad 179 to be in contact with a driving circuit (not shown) applying a data signal is formed on one end of the data line 171. The second source electrode 174s protrudes from the data line 171. The second drain electrode 174d is spaced apart from the second source electrode 174s, and faces the second source electrode 174s. Inner sidewalls of the first source and drain electrodes 165s and 165d protrude from, for example, inner sidewalls of the second source and drain electrodes 174s and 174d. Outer sidewalls of the second source and drain electrodes 174s and 174d protrude from, for example, outer sidewalls of the first source and drain electrodes 165s and 165d. A gap between the second source and drain electrodes 174s and 174d is, for example, greater than a gap between the first source and drain electrodes 165s and 165d. The second source electrode 174s is electrically connected to the first source electrode 165s through the first via hole 162a, and the second drain electrode 174d is electrically connected to the first drain electrode 165d through the second via hole 162b.

The data line 171 and the second source and drain electrodes 174s and 174d may contain the above-described material and may be formed by the above-described method.

Although not illustrated in the drawing, a capping layer may be formed on the second source and drain electrodes 174s and 174d. The capping layer may contain, for example, at least one of Cu-alloy nitride, CuMn alloy, CuMnAl alloy, CuMnN, and CuO. The capping layer may prevent the second source and drain electrodes 174s and 174d from being oxidized in a process of forming a below-described protection film 180.

The protection film 180 is disposed on the second source and drain electrodes 174s and 174d, and the etching prevention layer 160. The protection film 180 may contain the above-described material, and may be formed by the above-described method.

Contact holes 147, 185 and 187 are formed in the protection film 180. Referring to FIG. 5A, the first contact hole 185 is formed passing through the protection film 180, and exposes a portion of the second drain electrode 174d. Referring to FIG. 5B, the second contact hole 187 is formed passing through the protection film 180, and exposes a portion of the data pad 179. The data pad 179 may contain, for example, the same material as that of the second source and drain electrodes 174s and 174d. The third contact hole 147 is formed passing through the protection film 180, the etching prevention layer 160, and the gate insulting film 140, and exposes a portion of the gate pad 123. Although not illustrated, the data pad 179 may include, for example, the above-described capping layer. The gate pad 123 may include, for example, a first gate pad 123a and a second gate pad 123b. The gate pad 123 may contain, for example, the same material as that of the gate electrode 124. The etching prevention layer 160 is located on the gate pad 123 and under the data pad 179. According to an embodiment of the present invention, the data pad 179 is formed, for example, as a single layer, while the drain electrode 175 is formed as a double layer.

The pixel electrode 191 and contact members 193 and 195 are formed on the protection film 180. The pixel electrode 191 is electrically connected to the second drain electrode 174d through the first contact hole 185. The first contact member 193 is electrically connected to the data pad 179 through the second contact hole 187. The second contact member 195 is electrically connected to the gate pad 123 through the third contact hole 147. The pixel electrode 191 and the contact members 193 and 195 may be made of, for example, a transparent conductor such as indium-tin-oxide (ITO), aluminum-zinc-oxide (AZO), fluorine-doped tin oxide (FTO), antimony tin oxide (ATO), cerium tin oxide (CTO), gallium doped zinc oxide (GZO), cadmium tin oxide (CTO), and indium-zinc-oxide (IZO). The first and second contact members 193 and 195 serve to prevent corrosion of the data pad 179 and the gate pad 123.

Although the TFT panel 100 in FIG. 4 includes the same TFT as that in FIG. 1, the TFT panel 100 may alternatively include, for example, the same TFT as that in FIG. 3 according to an embodiment of the present invention. In this case, as the etching prevention layer 160 is formed, for example, only partially on top of the first source and drain electrodes 165s and 165d and on the semiconductor layer 154 exposed between the first source and drain electrodes 165s and 165d, the etching prevention layer 160 is not formed under the data pad 179 and on the gate pad 123.

According to an embodiment of the present invention, as the first source and drain electrodes 165s and 165d are located under the etching prevention layer 160, the channel length L may be determined taking into account, for example, only the process margin. On the other hand, in the conventional art, as the source and drain electrodes are disposed on the etching prevention layer, overlapping at least a portion thereof, the channel length increases by overlapping distances 2OD of the source and drain electrodes and the etching prevention layer. For example, assuming that the minimum distance A between the source and drain electrodes 173 and 175, which is possible in the process, is about 3.5 µm, a TFT whose channel length L is about 3.5 µm may be formed in an embodiment of the present invention. On the other hand, in the conventional art, the channel length is a sum (A+2OD) of the minimum distance A (=about 3.5 µm) between the source and drain electrodes and the overlapping distances 2OD of the source and drain electrodes and the etching prevention layer. The increased channel length of the TFT in the conventional art leads to an increase in channel width for the TFT to obtain a predetermined current Ids during its operation, thereby causing an increase in the area of the source and drain electrodes.

Therefore, according to an embodiment of the present invention, the channel width and the TFT size may be reduced by reducing the channel length of the TFT. In addition, a capacitance Cgs between the source and drain electrodes may be reduced by reducing the area of the source and drain electrodes. The reduced Cgs reduces kick-back voltage and variation of the kick-back voltage in a display device, thereby contributing to a decrease in quality defects of the display device. In addition, the reduction in area of the source and drain electrodes may contribute to an increase in aperture ratio of the display device.

In addition, according to an embodiment of the present invention, despite the misalignment of the etching prevention layer 160, a distance d between the gate electrode 124 and the first source electrode 165s, which may affect Cgs, is not changed because the first source and drain electrodes 165s and 165d are formed under the etching prevention layer 160. Therefore, Cgs remains unchanged despite the misalignment of the etching prevention layer 160, thereby preventing changes in performance of the TFT.

Figure 6:
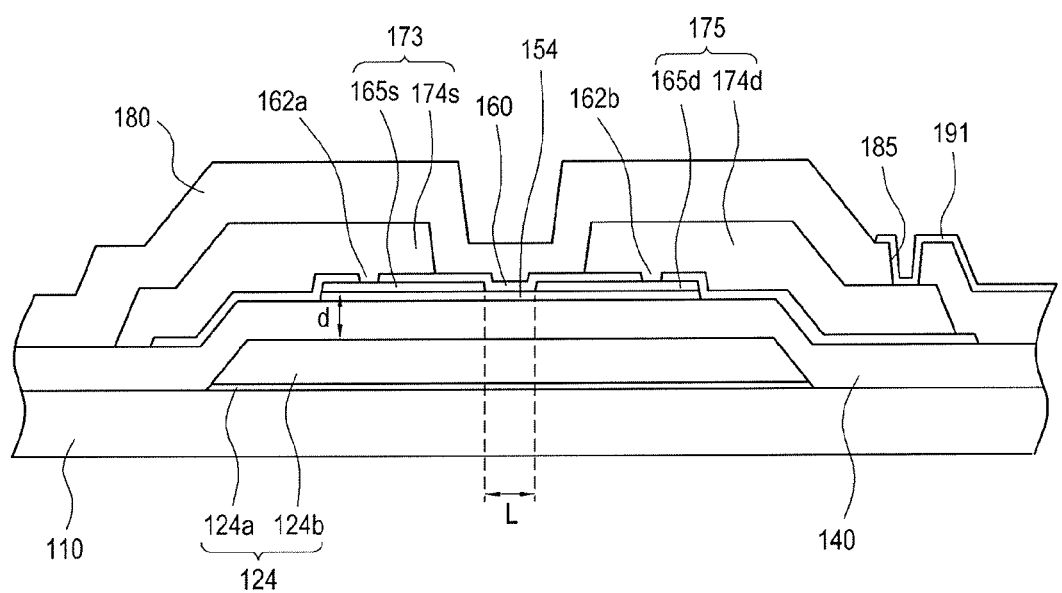
FIG. 6 is a cross-sectional view of a TFT panel according to an embodiment of the present invention.

FIG. 6 is a cross-sectional view of a TFT panel according to an embodiment of the present invention. The TFT panel is substantially the same as the TFT panel shown in FIGS. 4 and 5A except for the shape of the etching prevention layer 160. A repeated description of the same components will be omitted. Referring to FIG. 5A, the etching prevention layer 160 is formed on the gate insulating film 140 on the whole, fully overlapping the pixel electrode 191. On the other hand, referring to FIG. 6, the etching prevention layer 160 is formed to overlap the gate electrode 124 and the contact hole 185, making it possible to reduce a capacitance Cgp between the gate electrode 124 and the pixel electrode 191. Although not illustrated, according to an embodiment of the present invention, sidewalls of the etching prevention layer 160 may be located between a sidewall of the gate electrode 124 and a sidewall of the pixel electrode 191. In other words, the etching prevention layer 160 may, for example, overlap the gate electrode 124, but may not overlap the pixel electrode 191. The etching prevention layer 160 is formed to overlap the gate electrode 124, thereby making it possible to reduce a capacitance between the gate electrode 124 and the source electrode 173, or between the gate electrode 124 and the drain electrode 175. The etching prevention layer 160 is not formed to overlap the pixel electrode 191, e.g., the etching prevention layer 160 is not formed in an area where the pixel electrode 191 is formed, thereby contributing to an increase in light transmittance.

As is apparent from the foregoing description, according to exemplary embodiments of the present invention, the TFT size may be reduced and the capacitance between the gate and source electrodes may be reduced. In addition, the aperture ratio of the TFT panel may be increased.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A Thin Film Transistor (TFT) comprising:
a substrate;
a semiconductor layer disposed on the substrate;
a first source electrode and a first drain electrode spaced apart from each other on the semiconductor layer;
a channel area disposed in the semiconductor layer between the first source electrode and the first drain electrode;
an etching prevention layer disposed on the channel area, the first source electrode, and the first drain electrode;
a second source electrode in contact with the first source electrode, and a second drain electrode in contact with the first drain electrode;
a protection film disposed on the second source electrode and the second drain electrode and having a contact hole formed in the protection film exposing the second drain electrode; and
a pixel electrode disposed on the protection film and electrically connected to the second drain electrode through the contact hole, wherein the etching prevention layer overlaps the contact hole.

2. The TFT of claim 1, wherein a gap between the second source electrode and the second drain electrode is greater than a gap between the first source electrode and the first drain electrode.

3. The TFT of claim 2, wherein sidewalls of the semiconductor layer and outer sidewalls of the first source electrode and the first drain electrode are aligned substantially on a same line.

4. The TFT of claim 1, wherein sidewalls of the semiconductor layer and outer sidewalls of the first source electrode and the first drain electrode are aligned substantially on a same line.

5. The TFT of claim 1, wherein the etching prevention layer covers sidewalls of the semiconductor layer.

6. The TFT of claim 5, wherein the etching prevention layer has a first via hole and a second via hole, wherein the first source electrode and the second source electrode are in contact with each other through the first via hole, and wherein the first drain electrode and the second drain electrode are in contact with each other through the second via hole.

7. A Thin Film Transistor (TFT) panel comprising:
a gate line including a gate pad and a gate electrode disposed on a substrate;
a semiconductor layer disposed on the gate electrode;
a first source electrode and a first drain electrode spaced apart from each other on the semiconductor layer;
an etching prevention layer disposed on the first source electrode, the first drain electrode, and the semiconductor layer exposed between the first source electrode and the first drain electrode;
a second source electrode in contact with the first source electrode, a second drain electrode in contact with the first drain electrode, and a data line including a data pad;
a protection film disposed on the data line and having a contact hole formed in the protection film exposing the second drain electrode; and
a pixel electrode disposed on the protection film and electrically connected to the second drain electrode through the contact hole, wherein the etching prevention layer overlaps the contact hole.

8. The TFT panel of claim 7, wherein the etching prevention layer covers sidewalls of the semiconductor layer.

9. The TFT panel of claim 8, wherein the etching prevention layer overlaps the gate electrode.

10. The TFT panel of claim 9, wherein a sidewall of the etching prevention layer is located between a sidewall of the gate electrode and a sidewall of the pixel electrode.

11. The TFT panel of claim 8, wherein the etching prevention layer is located on the gate pad.

12. The TFT panel of claim 8, wherein the etching prevention layer is located under the data pad.

13. A Thin Film Transistor (TFT) panel comprising:
a gate line including a gate pad and a gate electrode disposed on a substrate;
a storage electrode line disposed on the substrate adjacent to the gate line and extending substantially in parallel to the gate line;
a gate insulating film disposed on the gate line and the storage electrode line;
a semiconductor layer disposed on the gate insulating film;
a first source electrode and a first drain electrode spaced apart from each other on the semiconductor layer;
a channel area disposed in the semiconductor layer between the first source electrode and the first drain electrode;
an etching prevention layer disposed on the first source electrode, the first drain electrode and the gate insulating film;
a second source electrode and a second drain electrode disposed on the etching prevention layer, wherein the second source electrode is in contact with the first source electrode, and wherein the second drain electrode is in contact with the first drain electrode;
a data line disposed on the etching prevention layer, wherein the data line includes a data pad formed at one end of the data line;
a protection film disposed on the second source electrode, the second drain electrode and the etching prevention layer, wherein the protection film includes a first contact hole formed in the protection film passing through the protection film which exposes a portion of the second drain electrode, a second contact hole formed in the protection film passing through the protection film exposing a portion of the data pad and a third contact hole formed in the protection film passing through the protection film, the etching prevention layer and the gate insulating film to expose a portion of the gate pad;
a pixel electrode disposed on the protection film, wherein the pixel electrode is electrically connected to the second drain electrode through the first contact hole; and
a first contact member and a second contact member disposed on the protection film, wherein the first contact member is electrically connected to the data pad through the second contact hole and wherein the second contact member is electrically connected to the gate pad through the third contact hole, and wherein the etching prevention layer overlaps the first contact hole.

14. The TFT panel of claim 13, wherein the storage electrode line overlaps a portion of the pixel electrode.

15. The TFT panel of claim 13, wherein the gate pad includes a first gate pad and a second gate pad.

16. The TFT panel of claim 13, wherein the first contact member and the second contact member are each formed of one of indium-tin-oxide (ITO) or indium-zinc-oxide (IZO).

17. The TFT panel of claim 13, wherein the gate line and the gate electrode each have a double layer structure comprising a first layer including titanium or a titanium alloy and a second layer including copper or a copper alloy.

18. The TFT panel of claim 13, wherein the etching prevention layer in addition to overlapping the first contact hole also overlaps the second contact hole.

* * * * *